(12) United States Patent
Liaw

(10) Patent No.: US 6,881,614 B2
(45) Date of Patent: Apr. 19, 2005

(54) SHARED CONTACT FOR HIGH-DENSITY MEMORY CELL DESIGN

(75) Inventor: Jhon-Jhy Liaw, hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/600,315

(22) Filed: Jun. 20, 2003

(65) Prior Publication Data

US 2004/0256732 A1 Dec. 23, 2004

(51) Int. Cl.⁷ .................. H01L 21/81; H01L 21/366
(52) U.S. Cl. .................. 438/161; 438/301; 438/303
(58) Field of Search .................. 438/161, 299–306; 257/382–412

(56) References Cited

U.S. PATENT DOCUMENTS 6,479,873 B1 * 11/2002 Yoshiyama et al. ......... 257/382

* cited by examiner

Primary Examiner—Cuong Nguyen
(74) Attorney, Agent, or Firm—Thomas, Kayden, Horstemeyer & Risley

(57) ABSTRACT

A new method and structure is created for a multi-transistor SRAM device. Standard processing steps are followed for the creation of CMOS devices of providing a patterned layer of gate material, of performing LDD impurity implants, of creating gate spacers. After the creation of the gate spacers, a new step of photoresist patterning and exposure is added. The mask for this additional step is a modified butt-contact mask, comprising enlarging the conventional butt-contact opening by between about 0.005 μm and 0.2 μm, an effect that can also be achieved by photo over-expose. This modified butt-contact mask exposes a spacer that is adjacent to the butt-contact hole, this spacer is removed. S/D impurity implant is performed after which conventional processing steps are applied for completion of the multi-transistor SRAM device.

32 Claims, 5 Drawing Sheets

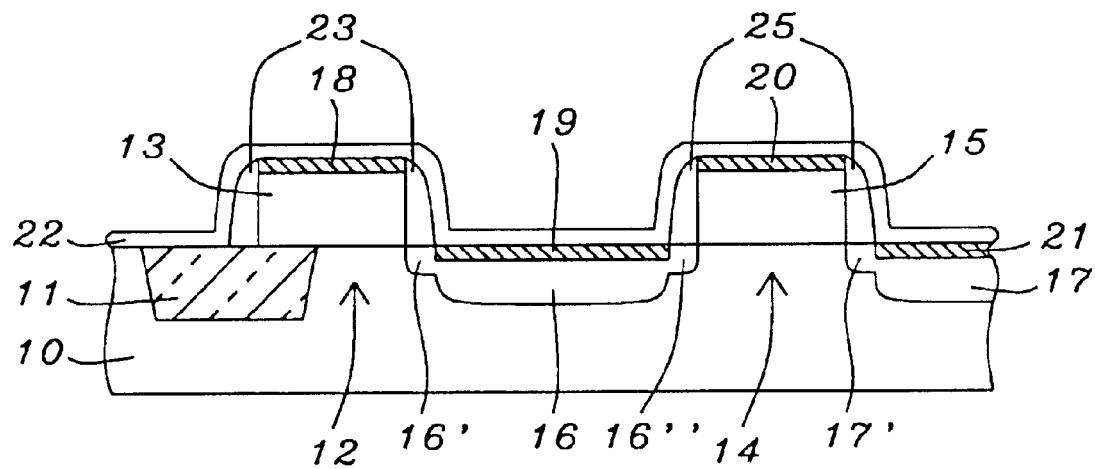
FIG. 1 — Prior Art
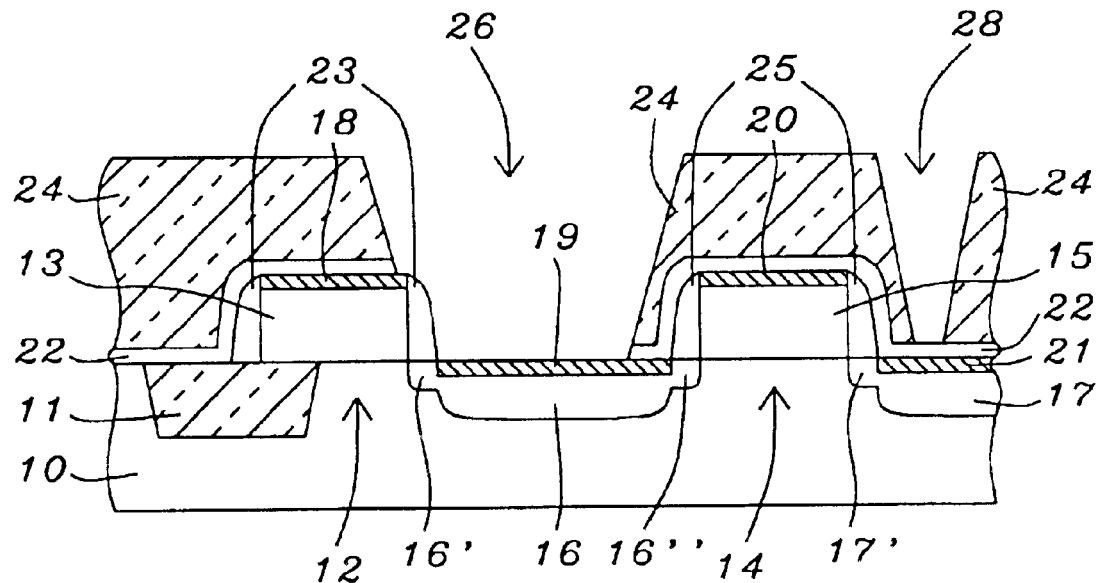
FIG. 2 — Prior Art

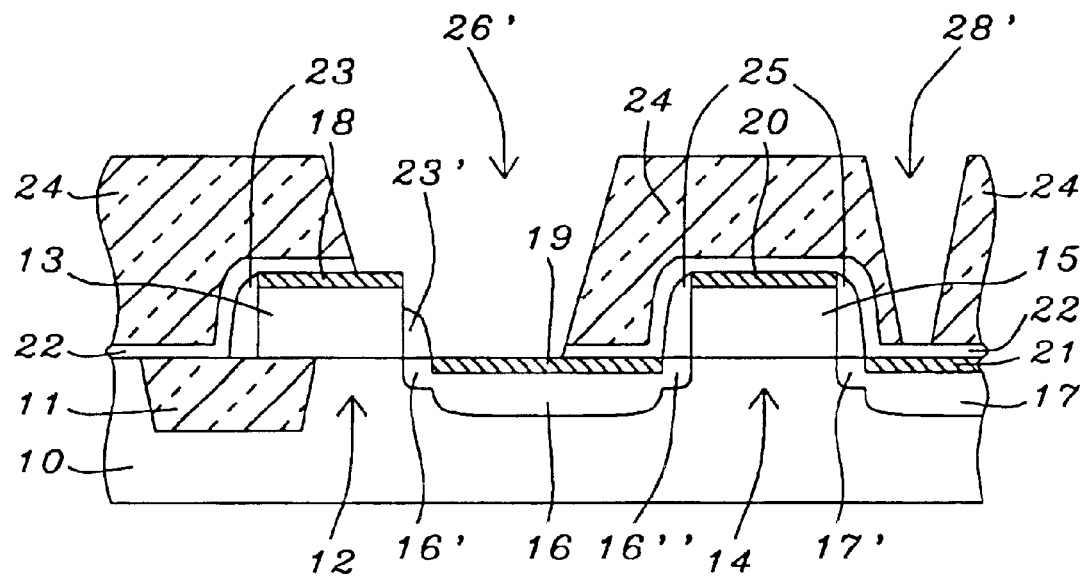
FIG. 3 - Prior Art
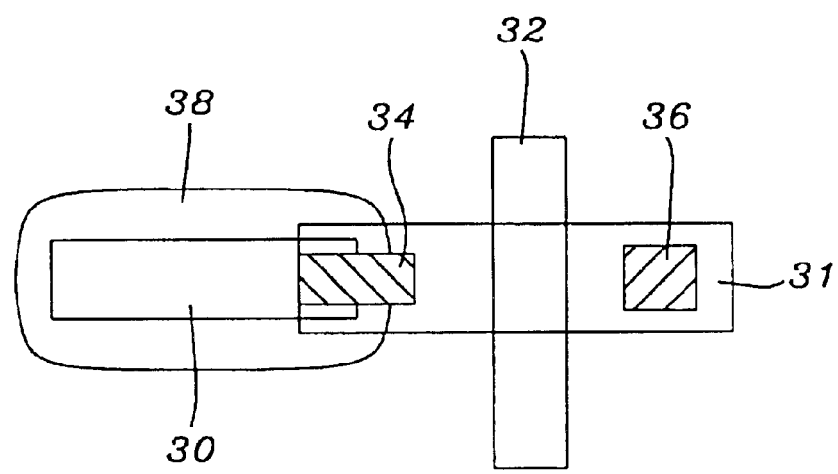
FIG. 4 - Prior Art

US 6,881,614 B2

SHARED CONTACT FOR HIGH-DENSITY MEMORY CELL DESIGN

BACKGROUND OF THE INVENTION (1) Field of the Invention

The invention relates to the fabrication of integrated circuit devices, and more particularly, to a method and structure for a new contact that connects an active area with a polysilicon interconnection.

(2) Description of the Prior Art

Conventional methods of forming CMOS gate electrodes in or over an active device region of a semiconductor substrate are well known in the art. The active device region is typically defined by field oxide regions, which electrically isolate the active region of the substrate from the surrounding surface areas of the substrate. Substrate conductivity in the active surface area is first established by providing n/p-well impurity implants into the active surface of the substrate. In fabricating a CMOS device, a layer of gate material such as polysilicon is formed over a layer of thin oxide that is formed over the active device region of the substrate. The polysilicon layer is then masked and both the exposed polysilicon and the underlying thin layer of oxide are etched to define a poly-silicon gate electrode that is separated from the substrate by the thin layer of gate oxide. Two masked steps for N-LDD and for P-LDD dopants are adopted to form lightly doped diffusion (LDD) source/drain regions in the substrate as a first phase of forming the substrate N-type source/drain regions of the CMOS device. After the formation of for instance oxide sidewall spacers over the sidewalls of the polysilicon gate and of the gate oxide, a second N-type and p-type impurity implant is performed to set the conductivity of the gate region to a desired level and to complete the N+ and P+ source/drain regions of the gate electrode.

Contact surfaces of the gate electrode may then be salicided by depositing for instance a layer of titanium or cobalt or nickel over the structure, more specifically over the exposed surfaces of the N+ and P+ source/drain regions and the gate region. The deposited titanium or cobalt or nickel is annealed, thereby causing the titanium to react with the underlying N+ and P+ silicon of the substrate of the source/drain regions and the doped polysilicon gate to form titanium salicide over these surfaces.

The gate electrode is completed by forming a layer of dielectric material, typically silicon oxide, over the gate electrode. Contact openings are etched in the dielectric and a metallization layer is formed to provide contacts to the salicided surfaces of the source/drain regions and over the polysilicon gate.

For maximum density to be achieved in a six-transistor SRAM device, the cells of the device must be created in as small a surface area as possible. A shared contact is therefore provided to simultaneously connect the gate and the active region of the cells, this contact is referred to as the butted or butt contact or the coupled contact or the shared contact. This approach however presents a challenge since the processing steps required to create the butt contact must simultaneously expose both a standard square contact and the butt contact. This results in a very difficult etch step, caused by differences in contact size, contact shape and fluctuations in the thickness of the etch stop layer that has been deposited over a polysilicon pattern of varying density. This may, under worst case circumstances, result in increased junction leakage, primarily caused by the etch for creation of the butt contact proceeding through the etch stop layer over the gate spacer causing excessive loss of the created gate electrode spacers. An additional concern is errors of miss-alignment between the butt contact and the polysilicon or between the butt contact and other critical points of electrical contact of the created SRAM device. The invention addresses these concerns of the creation of the butt contact.

U.S. Pat. No. 6,310,397 B1 (Chang et al.) shows a butt contact process in a SRAM.

U.S. Pat. No. 6,239,458 B1 (Liaw et al.) reveals a butt contact process.

U.S. Pat. No. 6,121,684 (Liaw) and U.S. Pat. No. 6,057,186 (Change et al.) reveal other butt contact methods.

SUMMARY OF THE INVENTION

A principal objective of the invention is to create a butt opening for a multi-transistor SRAM device that eliminates problems of leakage current between the butt contact and the underlying surface of the substrate of well type conductivity.

Another objective of the invention is to relax requirements of alignment when simultaneously creating a butting contact and a conventional contact.

Another objective of the invention is to enable a relaxation in the overlay design rule of the butt contact opening to conventional contact opening, increasing the overlay margin of the butt opening and the conventional contact opening.

Yet another objective of the invention is to create a butt contact opening while allowing for reduced cell surface area.

A new method and structure is created for a multi-transistor SRAM device. Standard processing steps are followed for the creation of CMOS devices of providing a patterned layer of gate material, of performing LDD impurity implants, of creating gate spacers. After the creation of the gate spacers, a new step of photoresist patterning and exposure is added. The mask for this additional step is a modified butt-contact mask, comprising enlarging the conventional butt-contact opening by between about 0.005 μm and 0.2 μm, an effect that can also be achieved by photo over-expose. This modified butt-contact mask exposes a spacer that is adjacent to the butt-contact hole, this spacer is removed. S/D impurity implant is performed after which conventional processing steps are applied for completion of the multi-transistor SRAM device.

BRIEF DESCRIPTION OF THE DRAWINGS

FIGS. 1 through 3 show cross sections of conventional methods of creating an opening for a butt contact and problems experienced there-with.

FIG. 4 shows a top view of a conventionally created butt contact opening and an adjacent conventional contact opening.

DESCRIPTION OF THE PREFERRED EMBODIMENTS

Figure 5:
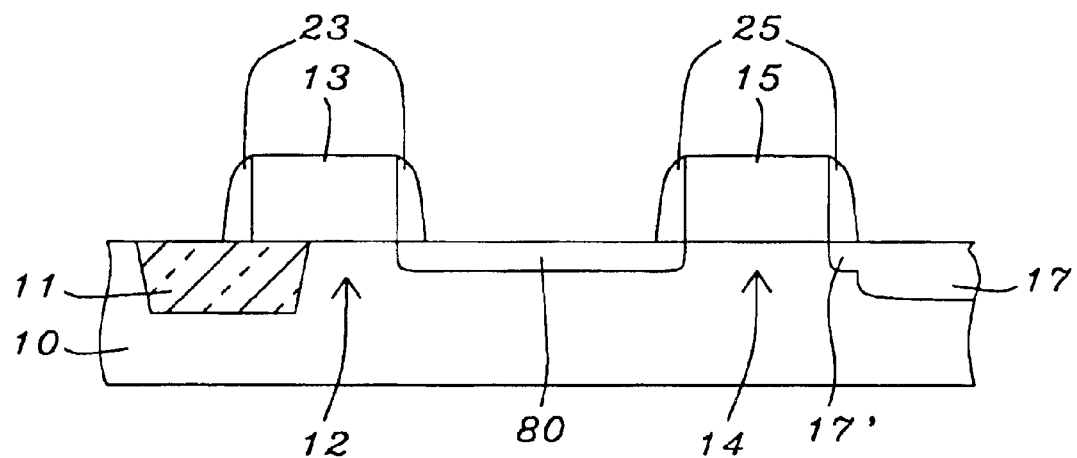
FIG. 5 shows a cross section off a gate electrode with the impurity implant.

For a better understanding of the invention, prior art steps for the simultaneous creation of a butt contact and a conventional contact are first explained. It must thereby understood that the butt-contact is created in order to establish electrical continuity between a layer of polysilicon, which forms a conductive layer of the SRAM device, and the active surface of the substrate over which the SRAM device is being created.

The cross section shown in FIG. 1 shows familiar elements in the creation of a SRAM device, specifically highlighted are:

10, the surface of a single crystalline silicon substrate 11, a region of Shallow Trench Isolation (STI) created in the surface of substrate 10, defining an active surface are of the substrate 10 over which a butt contact and a conventional contact are to be created 12 and 14, two gate electrodes created over the surface of substrate 10 with gate electrode 12 partially overlying a region 11 of field oxidation created in the surface of substrate 10

13 and 15, layers of gate material, preferably comprising polysilicon, that form the body of the gate electrodes 12 and 14

16, source/drain impurity implant of either n-type or p-type impurity, the butt contact is created to make contact with this impurity implant, the butt contact must overlay the polysilicon 13 and the S/D region 16

17, a source/drain impurity implant of either n-type or p-type impurity

17', an LDD impurity implant adjacent to and contiguous with source/drain impurity implant 17

16' and 16", LDD implants adjacent to source/drain impurity implant 16 and forming one contiguous region of n-type or p-type conductivity with the source/drain impurity implant 16

18 and 20, silicided layers over the surface of gate electrodes 12 and 14 respectively 19 and 22, silicided layers over the surface of source/drain impurity implants 16 and 17 respectively 22, a layer of etch stop material, preferably comprising silicon nitride or silicon oxynitride, deposited for subsequent etch of the butt contact opening 23 and 25, gate spacers formed over sidewalls of respectively gate electrodes 12 and 14.

The desired conventional results of creating a butt contact and simultaneously creating a conventional contact are shown in the cross section of FIG. 2, wherein opening 26 for the butt-contact and openings 28 for the conventional contact have been created through a layer 24 of dielectric.

As previously stated, the butt contact is created to make contact with impurity implant 16, the butt contact must overlay the polysilicon 13 and the S/D region 16.

The cross section of FIG. 3 shows that the etch for butt opening 26' has etched through the layer 22 of etch stop material where this layer overlies gate spacer 23' while in addition the gate spacer 23, FIG. 2, has been partially etched away, resulting in the gate spacer 23' of reduced isolating capability. The spacer 23' loss is induced by the main contact etch step (for openings 26' and 28') and by the step of removing stop layer 22.

The reduced in size gate 23' will form a leakage path. Specifically, the affected gate spacer 23' overlies the relatively shallow LDD impurity implant 16', therefore readily forming a low-resistance leakage path between the butt contact, created in opening 26', FIG. 3, and the well 16 of the underlying substrate 10.

FIG. 4 shows a top view of the discussed and created elements of a multi-cell SRAM device. Specifically highlighted are:

30, a second layer of poly-1, forming part of the interconnects of the SRAM device 32, a first layer of poly-1, overlying a gate electrode of the SRAM device 31, the active area defined over the surface of substrate 10, partially bounded and defined by STI region 11, FIG. 1

34, a top view of a butt contact that interconnects the active area 31 and poly-1 layer 32

36, a top view of a conventional contact such as contact created through opening 28 and 28', FIGS. 2 and 3

38, a top view of the gate spacers created over sidewalls of the layer of gate material.

The borderless etch that is applied for the creation of a contact opening, such as openings 26 (26') and 28 (28") in FIGS. 2 and 3 respectively, first etch the opening, stopping on the layer 22 of etch stop material. After the openings have been created, the etch stop layer is removed from the bottom of openings 26 and 26', as shown in the cross sections of FIGS. 2 and 3. The applied two etch steps typically cause severe nitride loss.

The invention follows, prior to processing steps that are unique to and of critical importance to the invention, conventional processing steps of creating a multi-transistor SRAM device to the point where gate spacers have been completed over the gate electrodes of the SRAM device. This structure is shown in cross section of FIG. 5, contact surfaces 18–21 have not yet been salicided at this point.

Recognized in the cross section of FIG. 5 will be:

active regions having been defined over the surface of substrate 10 by STI region 11

N/P well implants (not highlighted but implied)

the patterned layers 13/15 of poly-1

LDD implant 80, and the gate spacers 23/25.

The preferred material for gate spacers 23, FIG. 5, is silicon nitride, for the layers 13 and 15 of gate material the preferred material is polysilicon.

LDD implants 80 of the invention are preferably high-energy, high density implants, performed as follows:

For NMOS: As or P—energy 2 to 60 KeV
  dose 1E13 to 2E15 atoms/cm$^2$

For PMOS: $BF_2$ or B—energy 1 to 60 KeV
  dose 1E13 to 2E15 atoms/cm$^2$.

P-well (NMOS) region (not highlighted) can typically be created using the following implant processing parameters:

As or P—energy: 10 to 100 KeV
  dose: 1E14 to 5E16 atoms/cm$^2$.

N-well (PMOS) region (not highlighted) can typically be created using the following implant processing parameters:

boron or $BF_2$ or indium—energy: 5 to 200 KeV
  dose: 1E14 to 5E16 atoms/cm$^2$.

Figure 6:
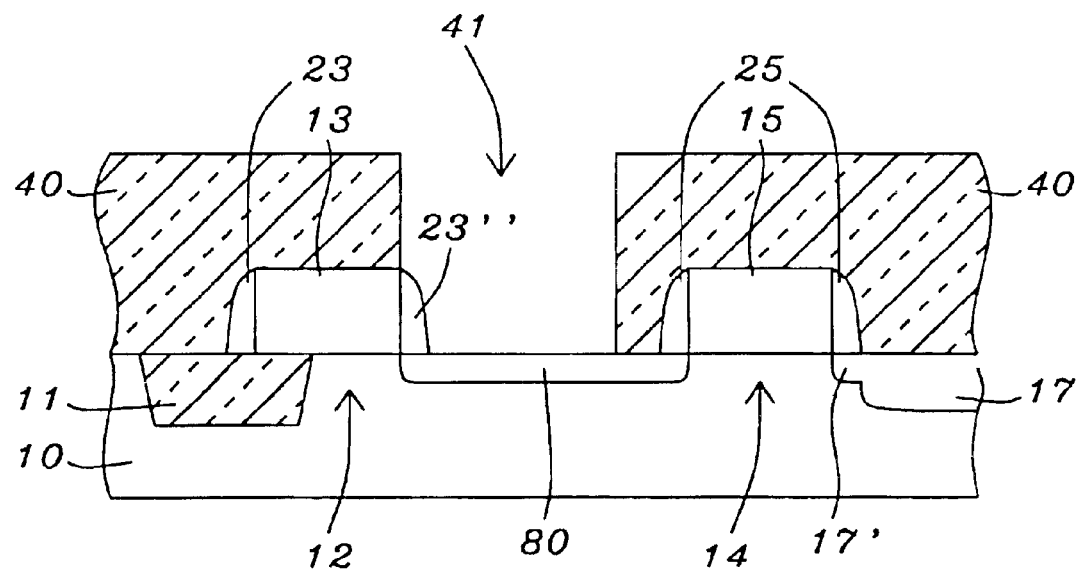
FIG. 6 shows a cross section after an etch blocking mask has been deposited using the modified exposure mask of the invention.

After the structure that is shown in cross section in FIG. 5 has been created, the invention creates, FIG. 6, an etch blocking mask 40, preferably comprising photoresist, over the surface of the structure. Opening 41, created through layer 40 of photoresist by applying conventional methods of photolithographic exposure and development, exposes the surface of the impurity implant 80 in addition to exposing the gate electrode spacer 23", FIG. 6, which has been created over the sidewall of gate electrode 12 that is adjacent to the location where the butt contact is to be created. This gate spacer 23" is the gate spacer, as has been explained above, that most readily leads to concerns of exposure and the creation of leakage currents.

The exposure mask that is used for the creation of opening 41 has the same pattern as the mask that, FIGS. 2 and 3, is used to simultaneously create the butt opening 26/26' and the conventional contact opening 28/28'. The pattern for the butt opening that is contained in the exposure mask however is increased in cross section so that the increased exposure, evident by comparing the cross section of FIG. 2 with the cross section of FIG. 6, can take place.

By exposing the gate spacer 23", FIG. 6, the invention provides for partially or completely removing the gate spacer 23", in this manner removing all possibility of this gate spacer 23" at a later time in the creation of the multi-transistor SRAM device forming a low-resistivity leakage path between the butt contact and the underlying impurity implant 16.

Figure 7:
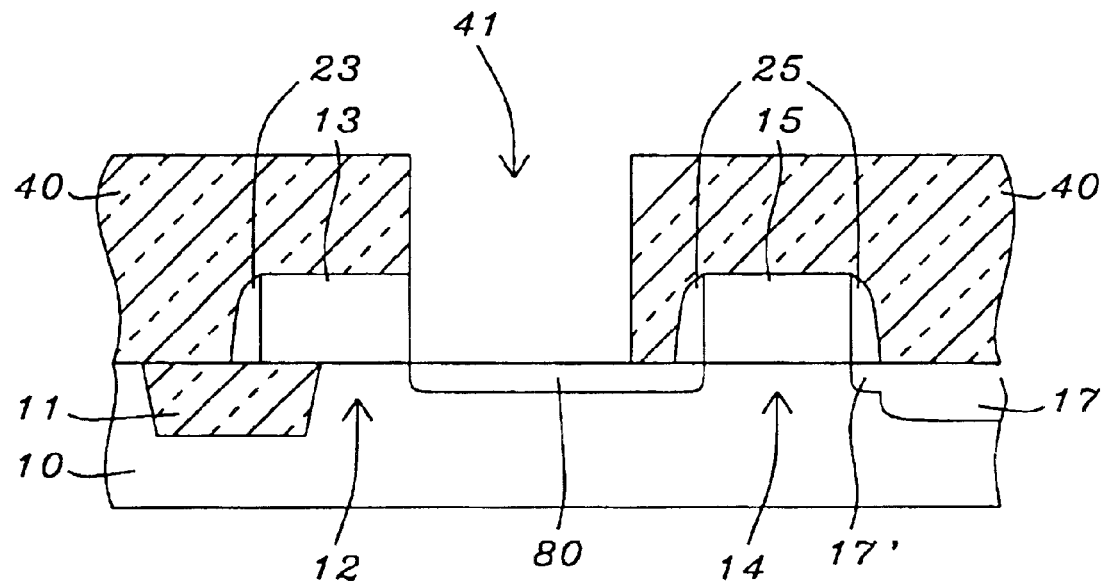
FIG. 7 shows a cross section after a gate spacer adjacent to a to be created butt contact opening has been removed.

The result of the etch of gate spacer 23" is shown in the cross section of FIG. 7. Relative to this latter etch the following comments are in order.

Gate spacers are frequently created over a layer of silicon oxide (not shown for reasons of clarity of the drawings) that interfaces between the etched layer of spacer material and the sidewalls of layers 13 and 15 of gate material. This layer of silicon oxide further overlies the substrate underneath the etched layer of gate material. The etch of the gate spacer, that is provided by the invention, is aimed at complete or partial removal of the gate spacer, which implies that the gate spacer material must be removed more readily than other, also exposed, materials.

Because it is desirable to leave the layer of silicon oxide (interfacing between the gate and the gate spacer and underneath the gate spacer) in place, since this layer frequently serves to repair surface damage incurred by the sidewalls of the gate structure and the silicon substrate during etch of the layer of gate material, the etch for the complete or partial removal of gate spacer material 23" must have a high etch selectively with respect to silicon oxide (of the interfacing layer) and to silicon (of the substrate). A preferred etch selectively is an etch selectively in excess of 10.

After the gate spacer 23" has been etched in accordance with the etch blocking mask 40, the etch blocking mask 40 is removed, applying conventional methods of photoresist ashing followed by a thorough surface clean.

Figure 8:
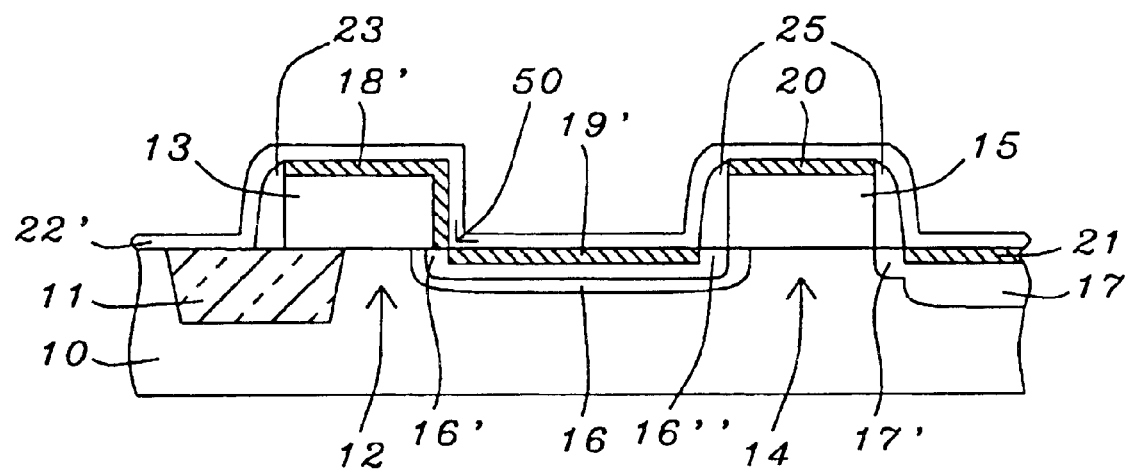
FIG. 8 shows a cross section after an etch stop layer has been deposited.

The invention now continues, FIG. 8, with conventional steps of implanting S/D impurities, leaving in place the LDD regions 16' and 16" in addition to creating the S/D impurity implant region 16. A more detailed cross section of the butt contact portion in the corner where the butt contact interfaces with the patterned layer 13 of poly-1 and the active region overlying the impurity implants 16/16' is shown in the cross section of FIG. 11.

Figure 11:
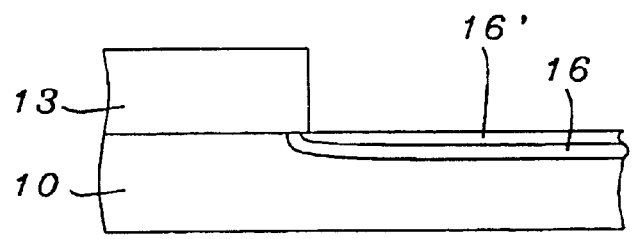
FIG. 11 shows a detailed cross section of LDD and S/D impurity implants.

More specifically shown in the cross section of FIG. 11 are the LDD impurity implant 16' and the S/D impurity implant 16. It is clear from the cross section shown in FIG. 11 that layer 16 of S/D underlies the LDD implant 16', that is both the LDD implant and the S/D implant cover the corner over which the butt contact is to be formed, thereby eliminating problems of leakage current between the butt contact and the underlying surface of the substrate of well type conductivity, thereby creating a butting contact and a conventional contact, thereby further enabling a relaxation in the overlay design rule of the butt contact opening to conventional contact opening, increasing the overlay margin of the butt opening and the conventional contact opening.

The LDD implant 16 is followed by surface salicidation, creating salicided surface layers 18, 19', 20, and 21, FIG. 8, after which a etch stop layer 22' is deposited, similar to the deposition of etch stop layer 22 in FIG. 1.

From the cross section that is shown in FIG. 8 it is clear that the area 50, where LDD impurity implant 16' and 16 interfaces with salicided layer 18', which extends along the sidewall of gate spacer material 13 from which the gate spacer 23" has been completely (or partially) removed, is a critical area. The impurities of both 16 and 16' are deeper into the surface of the substrate, further distancing the salicided layer 18' from the substrate.

Figure 9:
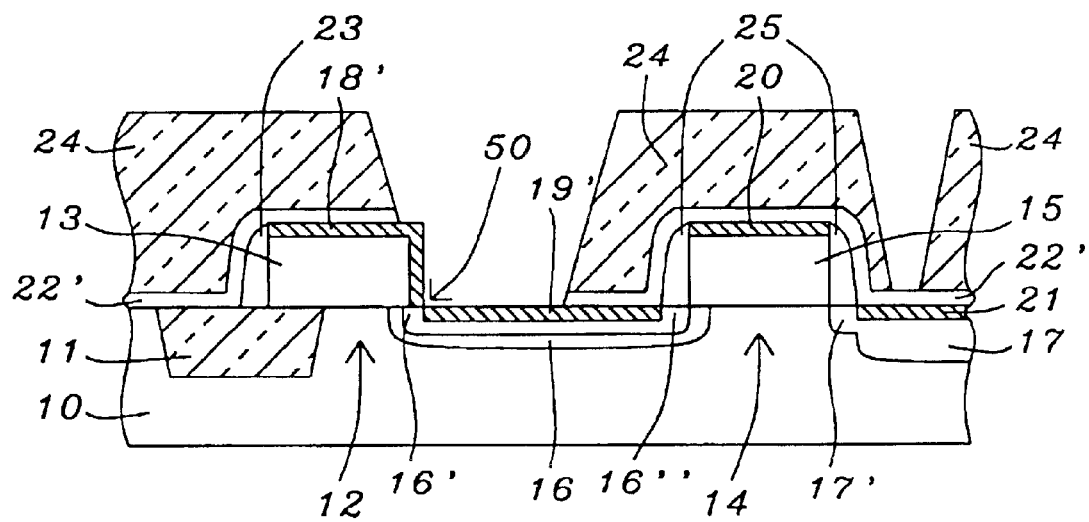
FIG. 9 shows a cross section after a butt opening has been created through a layer of dielectric whereby the butt opening is miss-aligned with respect to the underlying impurity implant.

By now, FIG. 9, creating a patterned and etched layer 24 of dielectric, similar to the layer 24 of dielectric shown in the cross section of FIG. 3, it is clear that in the intersection 50, which has previously been highlighted as being the critical intersection of the interface between the butt contact and the substrate, the invention provides for a relatively deep junction (S/d and LDD) over with silicide is created. This combination of design factors leads to reduced or no leakage in corner 50.

Figure 10:
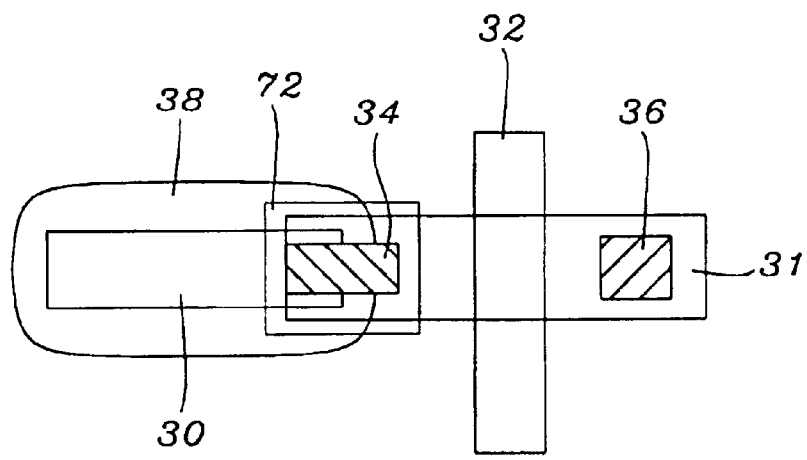
FIG. 10 shows a top view of the butt contact opening and an adjacent conventional contact opening created by the invention.

The top view shown in FIG. 10 shows, the layout of the butt contact, the conventional contact and the additional layer for the butt contact junction leakage improvements as highlighted above. Since the spacer is removed by the invention, the invention provides for a larger contact area for the butt contact.

The invention can be summarized as follows:
1. the invention provides for complete or partial removal of a gate spacer that is adjacent to the butt contact by applying for an extra etch
2. the invention provides for a modified butt-opening exposure mask, wherein the opening for the butt opening has been increased by between about 0.005 $\mu$m and 0.2 $\mu$m, and
3. the invention provides a deep junction profile on the corner of the poly-1 and the active region of butt contact cover portion.

For purposes of clarity, conventional processing steps are compared with the processing steps of the invention, as follow.

Conventional processing steps for the creation of a butt contact comprise:

define active region perform N/P well implant provide a patterned layer of poly-1 perform LDD implant form spacers over sidewalls of the patterned layer of poly-1 perform S/D implants perform salicidation of contact surfaces deposit an etch stop layer deposit a layer of dielectric, and form butt contact and standard contact in the layer of dielectric.

The invention provides for:

define active region perform N/P well implant provide a patterned layer of poly-1 perform LDD implant form spacers over sidewalls of the patterns layers of poly-1 at this time, the invention provides an extra mask for spacer remove (the butt contact portion)

perform S/D implant, whereby the S/D junction penetrates under and covers the corner in the interface between the poly-1 and the active region of the substrate underlying the butt contact perform salicidation deposit an etch stop layer deposit a layer of dielectric, and form butt contact and standard contact through the layer of dielectric.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. The creation of a butt contact opening for high-density memory cells, comprising:

providing a substrate, the substrate having been provided over an active surface area thereof with:

(i) at least one patterned and etched layer of gate material forming a gate electrode adjacent to which a butt contact opening is to be created;

(ii) LDD impurity implants self-aligned with the at least one patterned and etched layer of gate material; and (iii) A first and second gate spacer over sidewalls of the at least one patterned and etched layer of gate material, the second gate spacer overlying a sidewall of the at least one patterned and etched layer of gate material adjacent to which the butt contact opening is to be created;

depositing an etch blocking mask comprising etch blocking material over the substrate, including the at least one patterned and etched layer of gate material, exposing the second gate spacer;

etching the second gate spacer in accordance with the etch blocking mask;

removing the etch blocking mask;

performing S/D implant into the active surface of the substrate over which a butt contact opening is to be created; and complete processing of the substrate for the creation of the high-density memory cell.

2. The method of claim 1, the gate material preferably comprising polysilicon.

3. The method of claim 1, the gate spacers preferably comprising silicon nitride.

4. The method of claim 1, the LDD impurity implants being for NMOS devices and preferably comprising As or P, implanted with an energy of between about 2 to 60 KeV and a dose of between about 1E13 to 2E15 atoms/cm$^2$.

5. The method of claim 1, the LDD impurity implants being for PMOS devices and preferably comprising $BF_2$ or B, implanted with an energy of between about 1 to 60 KeV and a dose of between about 1E13 to 5E15 atoms/cm$^2$.

6. The method of claim 1, the S/D implant being a N-type S/D region comprising As or P, implanted with an energy between about 10 and 100 KeV and a dose between about 1E14 to 5E16 atoms/cm$^2$.

7. The method of claim 1, the S/D implant being a P-type S/D region comprising boron or BF2, implanted with an energy between about 5 and 200 KeV and a dose between about 1E14 to 5E16 atoms/cm$^2$.

8. The method of claim 1, the etch blocking mask material comprising photoresist.

9. The method of claim 1, the etch blocking mask comprising a pattern enlargement of a butt contact opening.

10. The method of claim 9, the enlargement comprising increasing a sizing rule for a butt contact opening by between about 0.005 and 0.2 $\mu$m.

11. The method of claim 1, the complete processing of substrate for the creation of the high-density memory cell comprising:

saliciding contact surfaces of the at least one patterned and etched layer of gate material and the etched second gate spacer;

depositing a layer of etch stop material over the substrate, including the at least one patterned and etched layer of gate material and the etched second gate spacer;

depositing a layer of dielectric over the etch stop layer; and patterning and etching the layer of dielectric and the etch stop layer, creating a butt contact opening through the layer of dielectric and the layer of etch stop layer, creating a conventional contact opening through the layer of dielectric, the butt contact opening being adjacent to the etched second gate spacer.

12. The creation of a butt contact opening for high-density memory cells, comprising:

providing a substrate, the substrate having been provided with:

(i) at least one patterned and etched layer of gate material forming the body of a gate electrode adjacent to which a butt contact opening is to be created;

(ii) high-density, two masked high energy LDD impurity implants comprising N-type (NLDD) or P-type (PLDD) implants;

(iii) a first and a second gate spacer over sidwalls of the at least one patterned and etched layer of gate material, the second gate spacer overlying a sidewall of the at least one patterned and etched layer of gate material adjacent to which the butt contact opening is to be created; and (iv) a high-density, high energy well implant over the surface of which the butt contact opening is to be created;

depositing an etch blocking mask of etch locking material comprising an enlarged sizing rule over the substrate, including the at least one patterned and etched layer of gate material, at least exposing the second gate spacer;

etching the second gate spacer in accordance with the etch blocking mask;

removing the etch mask;

performing an S/D impurity implant into the substrate; and completing processing of the substrate for creation of the high-density memory cell.

13. The method of claim 12, the gate material preferably comprising polysilicon.

14. The method of claim 12, the gate spacers preferably comprising silicon nitride.

15. The method of claim 12, the high-density LDD impurity implants being for NMOS devices and preferably comprising As or P, implanted with an energy of between about 2 to 60 KeV and a dose of between about 1E13 to 2E15 atoms/cm$^2$.

16. The method of claim 12, the high-density LDD impurity implants being for PMOS devices and preferably comprising $BF_2$ or B, implanted with an energy of between about 1 to 60 KeV and a dose of between about 1E13 to 2E15 atoms/cm$^2$.

17. The method of claim 12, the high-density well implant being for N-type implant comprising As or P, implanted with an energy of between about 10 to 100 KeV and a dose between about 1E14 to 5E16 atoms/cm$^2$.

18. The method of claim 12, the high-density well implant being for P-type implant comprising boron or B, implanted with an energy of between about 5 to 200 KeV and a dose between about 1E14 to 5E16 atoms/cm$^2$.

19. The method of claim 12, the etch blocking mask material comprising photoresist.

20. The method of claim 12, the enlarged sizing rule comprising a pattern of an enlarged butt contact opening.

21. The method of claim 12, the enlarged sizing rule comprising increasing a sizing rule for a butt contact opening by between about 0.005 and 0.2 µm.

22. The method of claim 12, the complete processing of substrate for the creation of the high-density memory cell comprising:

saliciding contact surfaces to the at least one patterned and etched layer of gate material, including the etched second gate spacer;

depositing a layer of etch stop material over the substrate, including the at least one patterned and etched layer of gate material and the etched second gate spacer;

depositing a layer of dielectric over the layer of etch stop material; and patterning and etching the layer of dielectric and the etch stop layer, creating a butt contact opening through the layer of dielectric and the layer of etch stop layer, creating a conventional contact opening through the layer of dielectric, the butt contact opening being adjacent to the etched second gate spacer.

23. The creation of a semiconductor device having a butt contact opening for high-density memory cells, comprising:

providing a substrate, an active region having been defined for the substrate;

performing N/P well implants into the surface of the substrate;

providing a patterned layer of gate electrode material over the active surface of the substrate, the patterned layer of gate electrode material having a first and a second sidewall, a butt contact having to be created comprising and laterally extending from the second sidewall;

performing LDD implant into the substrate, self-aligned with the patterned layer of gate electrode material, the LDD implant penetrating under and surrounding a corner where the second sidewall of the patterned layer of gate electrode material intersects with the active surface of the substrate over which a butt contact is to be created;

forming gate spacers over the first and the second sidewall of the patterned layer of gate electrode material;

creating an etch blocking mask over the patterned layer of gate electrode material, an opening through the etch blocking mask comprising and laterally extending from the second sidewall of the patterned layer of gate electrode material thereby exposing the spacer created over the second sidewall of the patterned layer of gate electrode material;

etching the spacer formed over the second sidewall of the patterned layer of gate electrode material in accordance with the etch blocking mask;

removing the etch blocking mask;

performing S/D implant into the substrate, the S/D implant underlying the LDD implant thereby providing that the S/D implant additionally penetrates under and surrounds the corner where the second sidewall of the patterned layer of gate electrode material intersects with the active surface of the substrate over which a butt contact is to be created;

performing salicidation of contact surfaces of the semiconductor device;

depositing an etch stop layer over salicided contact surfaces of the semiconductor device;

depositing a layer of dielectric over the etch stop layer;

patterning the deposited layer of dielectric to form therethrough a butt contact and a standard contact opening; and filing the butt contact and a standard contact opening with a conductive material.

24. The method of claim 23, the gate electrode material preferably comprising polysilicon.

25. The method of claim 23, the gate spacers preferably comprising silicon nitride.

26. The method of claim 23, the LDD impurity implant being for NMOS devices and preferably comprising As or P, implanted with an energy of between about 2 to 60 KeV and a dose of between about 1E13 and 2E15 atoms/cm$^2$.

27. The method of claim 23, the LDD impurity implant being for PMOS devices and preferably comprising $BF_2$ or B, implanted with an energy of between about 1 to 60 KeV and a dose of between about 1E13 and 2E15 atoms/cm$^2$.

28. The method of claim 23, the S/D implant being for N-type S/D region comprising As or P, implanted with an energy of between about 10 to 100 KeV and a dose between about 1E14 and 5E16 atoms/cm$^2$.

29. The method of claim 23, the S/D implant being for P-type S/D region comprising boron or BF2, implanted with an energy of between about 5 to 200 KeV and a dose between about 1E14 and 5E16 atoms/cm$^2$.

30. The method of claim 23, the etch blocking mask comprising photoresist.

31. The method of claim 23, the etch blocking mask comprising a pattern enlargement of a butt contact opening.

32. The method of claim 31, the enlargement comprising increasing a size rule for a butt contact opening by between about 0.005 and 0.2 µm.

* * * * *